United States Patent [19]
Chang et al.

[11] Patent Number: 5,706,228
[45] Date of Patent: Jan. 6, 1998

[54] METHOD FOR OPERATING A MEMORY ARRAY

[75] Inventors: Kuo-Tung Chang, Austin; Craig A. Cavins, Pflugerville; Ko-Min Chang, Austin; Bruce L. Morton, Austin; George L. Espinor, Austin, all of Tex.

[73] Assignee: Motorola, Inc., Schaumburg, Ill.

[21] Appl. No.: 603,939

[22] Filed: Feb. 20, 1996

[51] Int. Cl.$^6$ ............................................. G11C 11/40
[52] U.S. Cl. ........................... 365/185.18; 365/185.02; 365/185.24
[58] Field of Search ................... 365/185.18, 185.17, 365/185.24, 185.02

[56] References Cited

U.S. PATENT DOCUMENTS

| | | | |
|---|---|---|---|
| 4,961,002 | 10/1990 | Tam et al. | 365/185.18 |
| 5,047,981 | 9/1991 | Gill et al. | 365/184 |
| 5,191,556 | 3/1993 | Radjy | 365/235 |
| 5,267,209 | 11/1993 | Yoshida | 365/185.18 |
| 5,408,431 | 4/1995 | Challa | 365/185.17 |
| 5,471,422 | 11/1995 | Chang et al. | 365/185.26 |

*Primary Examiner*—Joseph A. Popek

[57] ABSTRACT

A memory array (25) having a selected memory cell (10) and an unselected memory cell (30) is programmed and read. Each memory cell in the memory array (25) contains an isolation transistor (22) and a floating gate transistor (23). To program the selected memory cell (10), programming voltages are applied to a control gate line (21), a drain line (14), an isolation line (19), and a source line (12). To reduce the effects of the drain disturb problem, a gate terminal (32) of the unselected memory cell (30) is held at a positive voltage. To read selected memory cell (10), a read voltage is applied to an isolation gate line (31) of unselected memory cell (30) which insures that the unselected memory cell (30) does not conduct or contribute to leakage current and power consumption during the read operation.

12 Claims, 2 Drawing Sheets

| OPERATION | VOLTAGE APPLIED (VOLTS) | | | | | | | |
|---|---|---|---|---|---|---|---|---|
| | SELECTED MEMORY CELL | | | | UNSELECTED MEMORY CELL | | | |
| | SOURCE | ISOLATION GATE | CONTROL GATE | DRAIN | SOURCE | ISOLATION GATE | CONTROL GATE | DRAIN |
| PROGRAM | 0 | 0 | −12 | 5 | 0 | 0 | 3.5 | 5 |
| ERASE | 0 | V$_{DD}$ | 15 | 0 | 0 | 0 | 0 | 0 |
| READ | 0 | V$_{DD}$ | 0−2 | 1 | 0 | 0 | 0−2 | 1 |

*FIG. 3*

METHOD FOR OPERATING A MEMORY ARRAY

BACKGROUND OF THE INVENTION

This invention relates, in general, to non-volatile semiconductor memory devices, and more particularly, to methods of operating electrically erasable and programmable read-only memory (EEPROM) devices.

EEPROMs are non-volatile memory devices which are erased and programmed using electrical signals. Within an EEPROM device are a plurality of memory cells, each of which may be individually programmed and erased. In general, an EEPROM cell includes a floating gate transistor and a select transistor. The select transistors in an EEPROM device are used to select individual EEPROM cells which are to be erased or programmed. The floating gate transistors in the device are those transistors which actually store the digital value of each particular memory cell.

To program and erase a cell, a phenomenon known as Fowler-Nordheim tunneling is commonly used to store either a positive or a negative charge on a floating gate electrode of the floating gate transistor. For example, programming is accomplished by applying a positive voltage to a drain and a gate of the select gate transistor while a control gate of the floating gate transistor is held at ground. As a result, electrons tunnel from the floating gate of the floating gate transistor through a tunnel dielectric to the drain, leaving the floating gate positively charged.

One particular configuration of EEPROM, is a flash EEPROM. Flash EEPROMs provide electrical erasing and programming capability, and generally have an increased circuit density since only one transistor per cell is needed. This increased circuit density comes at the cost of only being able to block erase a flash EEPROM array. Typically, the entire array is erased in a single step, or flash, which is why it is termed flash EEPROM.

Regardless of how the non-volatile memory array is implemented, most configurations suffer from two significant problems that are known in the art, band to band leakage and drain disturb. These problems occur during programming conditions and can either affect the reliability and data retention characteristics of the memory array or affect the performance of the programming sequence.

Band to band leakage occurs near the drain terminal of the floating gate transistor during programming. Due to the presence of a positive voltage potential on the drain terminal, leakage current is drawn from the substrate and into the drain terminal. In most implementations of non-volatile memory cells, the programming voltage is supplied by an internal charge pump. The charge pump, therefore, not only has to provide the current necessary to program each memory cell, but the charge pump must also compensate for this additional band to band leakage. This additional requirement on the charge pump increases the minimum size of the charge pump and increases the overall programming time of the memory array.

The second problem associated with programming non-volatile memory arrays is due to a drain disturb condition that exists at unselected memory cells while a neighboring selected memory cell is being programmed. In most array configurations, as a particular bit or row of bits are being programmed, there is a programming voltage present at the drain of all floating gate transistors, which share the same drain line. The presence of a programming voltage on the drain of each floating gate transistor in the memory array is sufficient to create a vertical electric field along the edge of the drain terminal of the floating gate transistors of all the unselected memory cells that are not being programmed. This vertical field is of sufficient magnitude to draw electrons from the floating gate of each of the unselected memory cells, which with time will disturb the stored value of the unselected memory cells.

The drain disturb problem has a cumulative effect in that there will be some finite amount of charge that is pulled off of the floating gate of an unselected memory cell each time a neighboring cell is programmed. With each programming sequence, the unselected memory cells are pulled closer to an indefinite or disturbed state. The number of programming sequences it takes to reach this point is a function of the program voltage and the amount of time the program voltage is present on the drain terminals.

Previously known attempts to immunize a memory cell from the effects of band to band leakage and the drain disturb problem have relied on modifications to the physical layout of the non-volatile memory array. These modifications are intended to electrically and physically isolate portions of the memory array from each other or to improve the retention capability of each memory cell. Such enhancements included adding isolation transistors between cells, or blocks of cells, or to increase the thickness and quality of the dielectric material used to isolate the floating gate of each memory cell. These enhancements come at a cost of increased layout space or processing complexity, which in turn increase the manufacturing cost of the non-volatile memory array.

By now it should be appreciated that it would be advantageous to provide a method for operating a non-volatile memory array that reduces the effects of band to band leakage and the drain disturb problem. It would also be advantageous if the method did not appreciably increase the processing complexity or manufacturing cost of the non-volatile memory array.

BRIEF DESCRIPTION OF THE DRAWINGS

FIG. 3 is a table demonstrating one method for operating a memory array according to the present invention.

DETAILED DESCRIPTION OF THE DRAWINGS

The present invention provides a method for improving band to band leakage and the drain disturb problem of a non-volatile memory array. To address these problems, previously known devices have modified either the layout of the memory array or adjusted the structure or each memory cell in the array. The present invention, however, modifies how a memory array is operated rather than modifying the physical design of the memory array.

Because only the operation of a non-volatile memory array is changed, there is no need to make expensive changes to either the layout of the memory array or design changes to the individual memory cell structure. Since the present invention does not encompass modifications to the memory array, it is not limited to a particular EEPROM cell structure. This allows the programming and reading techniques of the present invention to be used with a variety of non-volatile memory array configurations.

Figure 1:
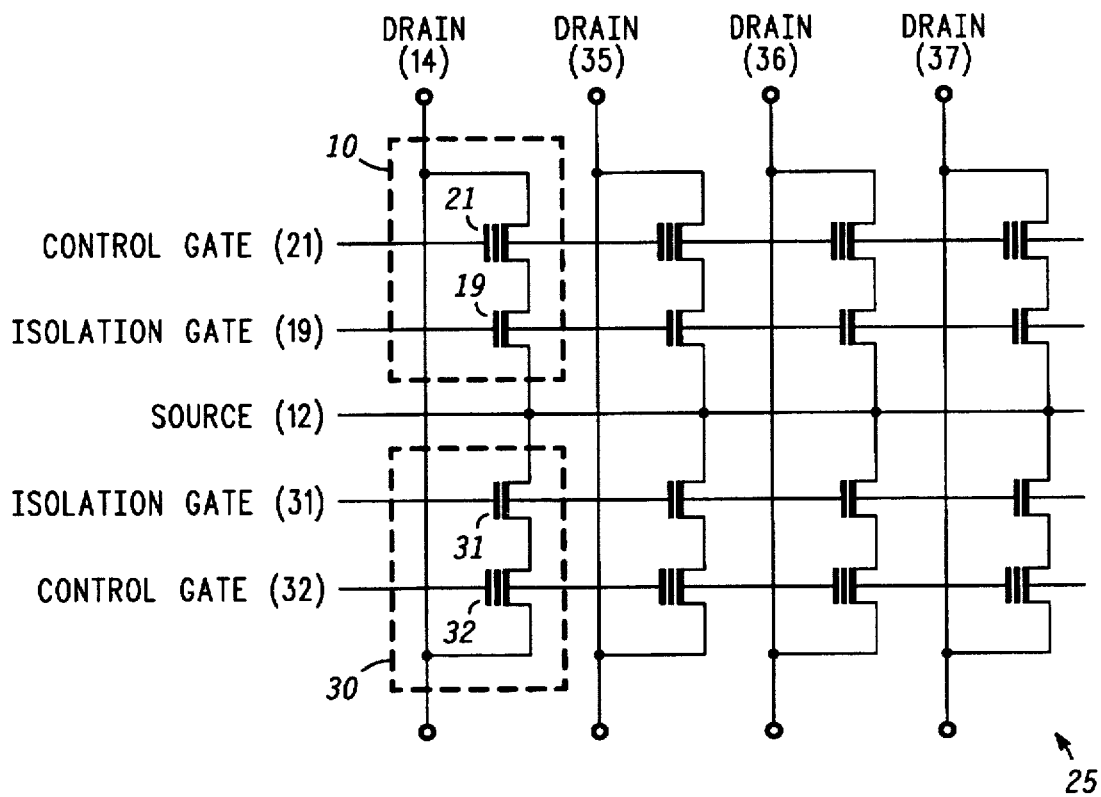
FIG. 1 is a schematic view showing a memory array.

Turning now to FIG. 1, a detailed description of the method of programming a non-volatile memory array according to the present invention will be provided. FIG. 1 shows a memory array 25 that is made up of individual memory cells each having an isolation transistor and a floating gate transistor. It should be understood that FIG. 1 is provided to give a schematic representation of a non-volatile memory array and that the present invention is not limited to this exact configuration or number of memory cells within memory array 25. One of the many features of the present invention is that the following operational techniques are compatible with memory arrays of various sizes and configurations.

In this particular example, memory array 25 is arranged to have two rows of memory cells with each row having four cells. Dashed boxes are used to identify the elements of two particular memory cells within memory array 25. For the purposes of the discussion to follow, memory array 25 comprises a selected memory cell 10 and an unselected memory cell 30. Selected memory cell 10 refers to the memory cell that is being either programmed, erased, or read, and unselected cell 30 refers to a neighboring cell in memory array 25 that is not enabled and is potentially undergoing the affects of the drain disturb phenomenon.

Figure 2:
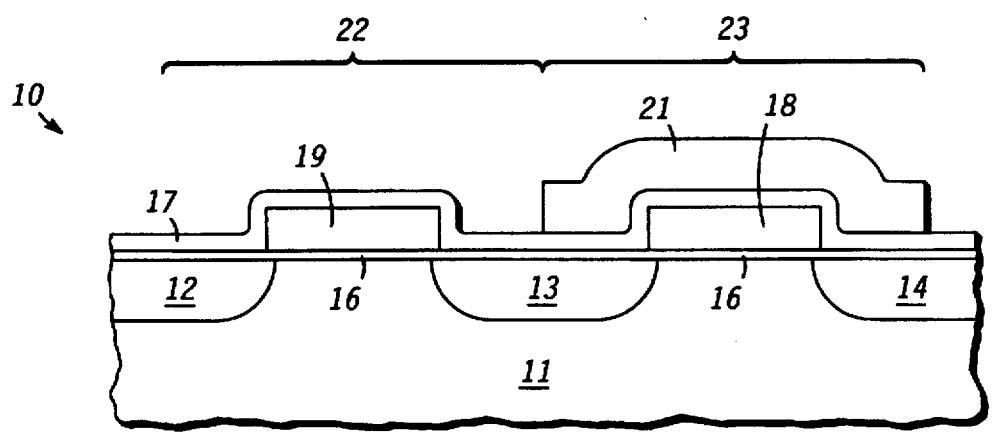
FIG. 2 is a cross-sectional view of a memory cell that can be used in conjunction with the present invention.

Each memory cell in memory array 25 is enabled by a control gate line, an isolation gate line, a source line, and a drain line. All of these signal lines provide the necessary voltage potentials to the appropriate portions of each memory cell during operation of memory array 25. As mentioned earlier, the embodiments of the present invention are not restricted to a certain memory cell configuration. However, for the purpose of clarity a particular memory cell structure will be provided as an example of a memory cell that can be used in memory array 25. FIG. 2 is an enlarged cross-sectional view of a memory cell 10 that can be used to implement each memory cell location.

As shown in FIG. 2, memory cell 10 comprises two transistors, an isolation transistor 22 and a floating gate transistor 23. Both the structure and manufacture of memory cell 10 are described in U.S. Pat. No. 5,471,422, which issued to Chang et al. on Nov. 28, 1995 and is hereby incorporated by reference. Isolation transistor 22 has a gate terminal 19 which is used to modulate a channel between source terminal 12 and drain terminal 13. Floating gate transistor 23 has a gate terminal 21 that is electrically isolated from floating gate structure 18 by a dielectric material 17, and gate terminal 21 is used as a control gate to modulate a channel between source terminal 13 and drain terminal 14. Note that drain terminal 13 of isolation transistor 22 also acts as the source terminal 13 of floating gate transistor 23. Both transistors 22 and 23 are formed on a common dielectric layer 16 which provides electrical isolation between substrate 11 and gate terminal 19 and floating gate structure 18.

Previously known non-volatile memory arrays typically comprise memory cells that are made of a single floating gate transistor that stores the logic state of each memory cell. Such memory arrays are generally configured such that a drain voltage for all transistors in a particular column are shared and so that a gate voltage is shared by all transistor in a common row. To program an individual memory cell, a negative voltage is applied to the gate terminal, the source line is grounded, and a positive voltage is applied to the drain line. In an array configuration, only selected floating gate transistors will have both the negative voltage on the gate and the positive voltage on the drain creating a large voltage differential to promote programming. It is well known, however, that other floating gate transistors that are in the same column as a memory cell that is being programmed will also have the positive voltage on their drains as well. These unselected memory cells, however, do not have the negative voltage applied to their gate terminals. Therefore, they do not have as large of a voltage differential as the memory cell that is being programmed, but still will have a voltage differential large enough to induce the drain disturb problem.

The programming technique of the present invention addresses this shortcoming of previously known memory arrays by reducing the voltage differential present at all unselected memory cells. Referring back to FIG. 1 for the following example, selected memory cell 10 will be programmed while unselected memory cell 30 is left undisturbed. Note that most of the signal lines are intentionally identified with the same element number of structures used in FIG. 2 since they are used to provide voltage potentials to these structures. To program selected memory cell 10 according to the present invention, a negative voltage, about −5 volts to −15 volts, is applied to gate terminal 21 with control gate line 21. A drain line 14 is used to apply a positive voltage, about 0.1 volts to 10 volts, to drain terminal 14 of floating gate transistor 23. An isolation gate line 19 is typically grounded, 0 volts, or has a low enough voltage to turn off isolation transistor 22. A source line 12, which is shared by both selected memory cell 10 and unselected memory cell 30, has a voltage potential of about −5 volts to 5 volts.

Now, the present invention differs from the previous art by applying different voltages to the terminals of unselected memory cell 30 as selected memory cell 10 is being programmed and verified. Instead of grounding the gate terminal of unselected transistors, a voltage of about 0.1 volts to 10 volts is applied to an unselected memory cell 30 using a control gate line 32. Since the voltage potential at gate terminal 32 is about 0.1 volts to 20 volts higher than at gate terminal 21, the drain disturb problem at unselected memory cell 30 is much improved. Since a positive voltage is applied to the gate terminal of unselected gates, as opposed to being grounded like in the prior art, the vertical field along the drain terminal of unselected gates is significantly reduced.

It should also be pointed out that the programming technique of the present invention cannot be used with the previously known memory arrays that have a single floating gate transistor for each memory cell. Because these previously known memory cells do not have an isolation transistor, the single floating gate transistor is exposed to all the voltages present in the memory array. If a positive voltage were to be applied to the gate terminal of unselected memory cells, the voltage would induce a channel between the source and drain of all floating gate transistors. This current flow would not only consume a tremendous amount of power, but would cause the unselected transistors to become programmed due to hot carrier injection (HCl).

The programming technique of the present invention not only protects the unselected memory cells from the drain disturb problem, but it also reduces the amount of current flowing from charge pumps. By reducing the vertical electric field at the drain terminal of all the unselected memory cells, the amount of current passing from the substrate to the drain terminal is significantly reduced. This in turn reduces the amount of current that is required to be provided by charge pumps during a programming sequence. Therefore, the present invention allows non-volatile memory arrays to be designed using small charge pumps which reduces the final manufacturing cost of the memory array.

The present invention also provides for an improved technique to read memory array 25 once selected memory cell 10 is programmed. To read the value stored in selected memory cell 10, about 0.1 volts to 5 volts is placed on drain line 14 and control gate line 21. The power supply voltage, Vdd, is placed on isolation gate line 19, and source line 12 is grounded. Once the voltages are set, the current passing through floating gate transistor 23 is measured to determine the state of memory cell 10.

Previously known reading techniques commonly ground the gate terminal of the unselected memory locations during a read operation. Even at a ground potential there will be some finite amount of leakage current passing through each memory cell. In large array configurations, this parasitic leakage will increase the power consumption of the read operation. The present invention, however, places a known voltage level on the gate terminal of the isolation transistor of unselected memory cells to insure that these memory cells do not conduct. For example, isolation gate line 31 is grounded to prevent unselected memory cell 30 from conducting. This not only reduces the amount of current needed by the charge pumps, but reduces the power consumption of memory array 25. This feature of the present invention allows the control gate of the unselected memory locations to be at any voltage potential. The unselected memory locations will not contribute to leakage current since they are electrically isolated by the isolation transistor.

FIG. 3 is provided to demonstrate a particular set of conditions for both the selected and unselected memory cells during a program, erase, and read operation. Note that this particular example falls within the ranges provided by the present invention and in no way should FIG. 3 be considered limiting when determining the bounds of the applicants invention.

By now it should be appreciated that the present invention provides a method for programming and reading a nonvolatile memory array. These methods reduce the effects of both the drain disturb and band to band leakage problems. The methods of the present invention do not require any modifications to the design or processing of existing memory arrays, and therefore, the present invention improves the reliability and functionality of a memory array without any additional manufacturing costs.

What is claimed is:

1. A method for operating a memory array that includes reading a selected memory cell comprising the steps of:
   providing the memory array including a selected memory cell and an unselected memory cell, wherein:
      each of the selected and unselected memory cells has an isolation transistor and a floating gate transistor a drain terminal, and a source terminal;
      each of the isolation and floating gate transistors has a gate terminal; and
      the drain terminals of the selected and unselected memory cells are electrically connected to each other;
   applying a first voltage potential having a first polarity to the gate terminal of the floating gate transistor of the selected memory cell;
   applying a second voltage potential having the first polarity to the drain terminals of the selected and unselected memory cells; and
   applying a third voltage potential having the first polarity to the gate terminal of the floating gate transistor of the unselected memory cell.

2. The method for operating the memory array of claim 1, further comprising a step of selectively programming the selected memory cell including the steps of:
   applying a fourth voltage potential having the first polarity to the drain terminals of the selected and unselected memory cells; and
   applying a fifth voltage potential having a second polarity to the gate terminal of the floating gate transistor of the selected memory cell, wherein the second polarity is opposite the first polarity; and
   applying a sixth voltage potential having the first polarity to the gate terminal of the floating gate transistor of the unselected memory cell.

3. The method of claim 2, further comprising a step of applying about −5 volts to 5 volts to the source terminal and the gate terminal of the isolation transistor of the selected memory cell.

4. The method of claim 2, wherein:
   the step of applying the fourth voltage potential comprises a step of applying about 0.1 volts to 10 volts;
   the step of applying the fifth voltage potential comprises a step of applying about −5 volts to −15 volts;
   the step of applying the sixth voltage potential comprises a step of applying about 0.1 volts to 10 volts; and
   the method further comprises a step applying about 0 volts to the source terminals of the selected and unselected memory cells and to the isolation gates of the selected and unselected memory cells.

5. The method of claim 4, wherein:
   the first voltage potential is about 0 volts to 2 volts;
   the second voltage potential is about 0.1 volts to 5 volts; and
   the third voltage potential is greater than 0 volts but no greater than 2 volts.

6. The method of claim 1, wherein the first voltage potential is about 0 volts to 2 volts.

7. The method of claim 1, wherein the second voltage potential is about 0.1 volts to 5 volts.

8. The method of claim 1, wherein the third voltage potential is greater than 0 volts but no greater than 2 volts.

9. The method of claim 1, wherein:
   the first voltage potential is about 0 volts to 2 volts;
   the second voltage potential is about 0.1 volts to 5 volts; and
   the third voltage potential is greater than 0 volts but no greater than 2 volts.

10. The method of claim 9, wherein:
    applying about 0 volts to the source terminals for the selected and unselected memory cells and to the isolation gate of the unselected memory cell; and
    applying about a $V_{DD}$ potential to the isolation gate of the selected memory cell.

11. The method of claim 1, further comprising the step of determining a current passing through the floating gate transistor of the selected memory cell.

12. The method of claim 1, further comprising steps of:
    applying a fourth voltage potential to the gate terminal of the isolation transistor of the selected memory cell; and
    applying a fifth voltage potential to the gate terminal of the isolation transistor of the unselected memory cell, wherein the fourth voltage potential is higher than the fifth voltage potential.

* * * * *